United States Patent
Xu et al.

(10) Patent No.: US 10,209,299 B2
(45) Date of Patent: Feb. 19, 2019

(54) TEST APPARATUS AND TESTABLE ASYNCHRONOUS CIRCUIT

(71) Applicant: Huawei Technologies Co., Ltd., Shenzhen (CN)

(72) Inventors: Zhen Xu, Hangzhou (CN); Yuqing Zhao, Hangzhou (CN); Xiaocheng Liu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 38 days.

(21) Appl. No.: 15/432,741

(22) Filed: Feb. 14, 2017

(65) Prior Publication Data

US 2017/0160340 A1    Jun. 8, 2017

Related U.S. Application Data

(63) Continuation of application No. PCT/CN2014/084470, filed on Aug. 15, 2014.

(51) Int. Cl.
*G01R 31/28* (2006.01)
*G06F 11/00* (2006.01)
(Continued)

(52) U.S. Cl.
CPC ... *G01R 31/2882* (2013.01); *G01R 31/31704* (2013.01); *G01R 31/318541* (2013.01); *G06F 11/25* (2013.01)

(58) Field of Classification Search
CPC ........ G01R 31/318547; G01R 31/3177; G01R 31/318566; G01R 31/318563; G01R 31/31813; G01R 31/318335; G01R 31/318569; G01R 31/318385; G01R 31/3181; G01R 31/31724; G01R 31/318544; G01R 31/2882; G01R 31/31704; G06F 11/25
See application file for complete search history.

(56) References Cited

U.S. PATENT DOCUMENTS 5,701,308 A * 12/1997 Attaway ........ G01R 31/318335
714/25
7,373,570 B2    5/2008 Hanamori et al.
(Continued)

FOREIGN PATENT DOCUMENTS

CN            1793999 A        6/2006
CN          102043122 A        5/2011
(Continued)

*Primary Examiner* — Guerrier Merant
(74) *Attorney, Agent, or Firm* — Leydig, Voit & Mayer, Ltd.

(57) ABSTRACT

Disclosed are a test apparatus and a testable asynchronous circuit. The test apparatus includes: a first input end, a second input end, a third input end, a fourth input end, a fifth input end, a first selector, a second selector, a D flip-flop, and a first output end. The first input end is configured to input a data signal or a test result of a previous circuit under test; the second input end is configured to input a test excitation signal or a test result that is output by a previous test apparatus; the third input end is configured to input a clock signal; the fourth input end is configured to input a selection signal; and the fifth input end is configured to input a selection signal.

10 Claims, 8 Drawing Sheets

(51) Int. Cl.
    *G01R 31/317*     (2006.01)
    *G06F 11/25*     (2006.01)
    *G01R 31/3185*     (2006.01)

(56) References Cited

U.S. PATENT DOCUMENTS 9,535,121 B1 *   1/2017   Taneja ............ G01R 31/318558
2012/0124439 A1   5/2012   Kim et al.

FOREIGN PATENT DOCUMENTS

| | | |
|---|---|---|
| FR | 2771510 A1 | 5/1999 |
| JP | 2001185622 A | 7/2001 |
| JP | 2003215214 A | 7/2003 |

* cited by examiner

# TEST APPARATUS AND TESTABLE ASYNCHRONOUS CIRCUIT

CROSS-REFERENCE TO RELATED APPLICATIONS

This application is a continuation of International Application No. PCT/CN2014/084470, filed on Aug. 15, 2014, the disclosure of which is hereby incorporated by reference in its entirety.

TECHNICAL FIELD

The present invention relates to the circuit test field, and more specifically, to a test apparatus and a testable asynchronous circuit.

BACKGROUND

Manufacturing a Very Large Scale Integrated Circuit (VLSI) includes hundreds of technological processes. A subtle change in the manufacturing processes may cause a physical defect on a chip, and as a result, the chip cannot work normally.

To ensure quality of a chip at delivery, testing is an essential part in a semiconductor realization process. The testing is actually a process in which a test excitation signal is loaded to an input pin of a semiconductor product that needs to be tested, then a circuit response is tested in an output pin of the semiconductor product, and the circuit response is compared with an expected response to determine whether a circuit is faulty.

Design for testability Design For Testability (DFT) becomes an important part in circuit and chip design. Various hardware logics used to improve chip testability are inserted into an original design of a chip, so that the chip becomes easily tested. A scan-based design is a most commonly used method in the design for testability. The scan-based design refers to replacement of ordinary flip-flops (flip-flops) in a circuit with scan flip-flops that have a scan capability and are connected to form a scan chain. The scan chain divides an inner sequential circuit into small combinational circuits, and a test vector is generated by using an Automatic Test Pattern Generator (ATPG) tool. The test vector is input to the inside of the chip by using the scan chain, and a corresponding result generated after the test vector is input is serially output through a specific pin of the chip, to achieve an objective of controlling and observing values of the flip-flops.

However, no system clock exists in a token (token) based asynchronous circuit, and therefore, the circuit cannot be tested in a scan manner.

SUMMARY

Embodiments of the present invention provide a test apparatus and a testable asynchronous circuit, so that an asynchronous circuit can be tested.

According to a first aspect, a test apparatus is provided, including:

a first input end 141, a second input end 142, a third input end 143, a fourth input end 144, a fifth input end 145, a first selector 110, a second selector 120, a D flip-flop 130, and a first output end 151, where the first input end 141 is configured to input a data signal or a test result of a previous circuit under test; the second input end 142 is configured to input a test excitation signal or a test result that is output by a previous test apparatus; the third input end 143 is configured to input a clock signal; the fourth input end 144 is configured to input a selection signal; and the fifth input end 145 is configured to input a selection signal;

a first input end of the first selector 110 and a first input end of the second selector 120 are connected to the first input end 141 of the test apparatus;

a second input end of the first selector 110 is connected to the second input end 142 of the test apparatus;

a selection signal end of the first selector 110 is connected to the fourth input end 144 of the test apparatus;

an output end of the first selector 110 is connected to a D input end of the D flip-flop 130;

a Q output end of the D flip-flop 130 is connected to a second input end of the second selector 120;

a clock signal input end of the D flip-flop 130 is connected to the third input end 143 of the test apparatus;

a selection signal end of the second selector 120 is connected to the fifth input end 145 of the test apparatus;

an output end of the second selector 120 is connected to the first output end 151 of the test apparatus;

the first selector 110 is configured to: according to the selection signal that is input at the fourth input end 144 of the test apparatus, determine to output the signal that is input at the first input end 141 of the test apparatus or the second input end 142 of the test apparatus to the D input end of the D flip-flop 130;

the D flip-flop 130 is configured to output, at the Q output end of the D flip-flop 130 and on a pulse edge of the clock signal that is input at the third input end 143 of the test apparatus, the signal that is input at the D input end; and the second selector 120 is configured to: according to the selection signal that is input at the fifth input end 145 of the test apparatus, determine to output, to the first output end 151 of the test apparatus, the signal that is input at the first input end 141 of the test apparatus or the signal that is output at the Q output end of the D flip-flop 130.

With reference to the first aspect, in a first possible implementation manner, the test apparatus further includes:

a second output end 152, connected to the Q output end of the D flip-flop 130.

With reference to the first possible implementation manner of the first aspect, in a second possible implementation manner, the test apparatus further includes:

a third selector 160 and a third output end 153, where a first input end of the third selector 160 is connected to the first input end 141 of the test apparatus, a second input end of the third selector 160 is connected to the third input end 143 of the test apparatus, a selection signal end of the third selector 160 is connected to the fifth input end 145 of the test apparatus, and an output end of the third selector 160 is connected to the third output end 153 of the test apparatus; and the third selector 160 is configured to: according to the selection signal that is input at the fifth input end 145 of the test apparatus, determine to output the signal that is input at the first input end 141 of the test apparatus or the signal that is input at the third input end 143 of the test apparatus to the third output end 153 of the test apparatus.

With reference to the first aspect or the first or the second possible implementation manner of the first aspect, in a third possible implementation manner, the fifth input end 145 of the test apparatus is configured to input a selection signal corresponding to the first input end of the second selector 120;

the first input end 141 of the test apparatus is configured to input a data signal; and the second selector 120 is configured to: according to the selection signal that is corresponding to the first input end of the second selector 120 and input at the fifth input end 145 of the test apparatus, determine to output the data signal that is input at the first input end 141 of the test apparatus to the first output end 151 of the test apparatus.

With reference to the first aspect or the first or the second possible implementation manner of the first aspect, in a fourth possible implementation manner, the fifth input end 145 of the test apparatus is configured to input a selection signal corresponding to the second input end of the second selector 120;

the fourth input end 144 of the test apparatus is configured to input a selection signal corresponding to the second input end of the first selector 110;

the second input end 142 of the test apparatus is configured to input a test excitation signal;

the first selector 110 is configured to: according to the selection signal that is corresponding to the second input end of the first selector 110 and input at the fourth input end 144 of the test apparatus, determine to output the test excitation signal that is input at the second input end 142 of the test apparatus to the D input end of the D flip-flop 130;

the D flip-flop 130 is configured to output, at the Q output end and on the pulse edge of the clock signal that is input at the third input end 143 of the test apparatus, the test excitation signal that is input at the second input end 142 of the test apparatus; and the second selector 120 is configured to: according to the selection signal that is corresponding to the second input end of the second selector 120 and input at the fifth input end 145 of the test apparatus, determine to output, to the first output end 151 of the test apparatus, the test excitation signal that is output at the Q output end.

With reference to the second possible implementation manner of the first aspect, in a fifth possible implementation manner, the fifth input end 145 of the test apparatus is configured to input a selection signal corresponding to the first input end of the second selector 120 and the first input end of the third selector 160;

the first input end 141 of the test apparatus is configured to input a data signal;

the second selector 120 is configured to: according to the selection signal that is corresponding to the first input end of the second selector 120 and the first input end of the third selector 160 and input at the fifth input end 145 of the test apparatus, determine to output the data signal that is input at the first input end 141 of the test apparatus to the first output end 151 of the test apparatus; and the third selector 160 is configured to: according to the selection signal that is corresponding to the first input end of the second selector 120 and the first input end of the third selector 160 and input at the fifth input end 145 of the test apparatus, determine to output the data signal that is input at the first input end 141 of the test apparatus to the third output end 153 of the test apparatus.

With reference to the second possible implementation manner of the first aspect, in a sixth possible implementation manner, the fifth input end 145 of the test apparatus is configured to input a selection signal corresponding to the second input end of the second selector 120 and the second input end of the third selector 160;

the fourth input end 144 of the test apparatus is configured to input a selection signal corresponding to the second input end of the first selector 110;

the second input end 142 of the test apparatus is configured to input a test excitation signal;

the first selector 110 is configured to: according to the selection signal that is corresponding to the second input end of the first selector 110 and input at the fourth input end 144 of the test apparatus, determine to output the test excitation signal that is input at the second input end 142 of the test apparatus to the D input end of the D flip-flop 130;

the D flip-flop 130 is configured to output, at the Q output end and on the pulse edge of the clock signal that is input at the third input end 143 of the test apparatus, the test excitation signal that is input at the second input end 142 of the test apparatus;

the second output end 152 of the test apparatus is configured to output the test excitation signal that is output at the Q output end;

the second selector 120 is configured to: according to the selection signal that is corresponding to the second input end of the second selector 120 and the second input end of the third selector 160 and input at the fifth input end 145 of the test apparatus, determine to output, to the first output end 151 of the test apparatus, the test excitation signal that is output at the Q output end; and the third selector 160 is configured to: according to the selection signal that is corresponding to the second input end of the second selector 120 and the second input end of the third selector 160 and input at the fifth input end 145 of the test apparatus, determine to output the clock signal that is input at the third input end 143 of the test apparatus to the third output end 153 of the test apparatus.

With reference to the second possible implementation manner of the first aspect, in a seventh possible implementation manner, the fifth input end 145 of the test apparatus is configured to input a selection signal corresponding to the second input end of the second selector 120 and the second input end of the third selector 160;

the fourth input end 144 of the test apparatus is configured to input a selection signal corresponding to the first input end of the first selector 110;

the first input end 141 of the test apparatus is configured to input a test result of a previous circuit under test;

the first selector 110 is configured to: according to the selection signal that is corresponding to the first input end of the first selector 110 and input at the fourth input end 144 of the test apparatus, determine to output the test result of the previous circuit under test that is input at the first input end 141 of the test apparatus to the D input end of the D flip-flop 130;

the D flip-flop 130 is configured to output, at the Q output end and on the pulse edge of the clock signal that is input at the third input end 143 of the test apparatus, the test result of the previous circuit under test that is input at the first input end 141 of the test apparatus; and the second output end 152 of the test apparatus is configured to output the test result of the previous circuit under test that is output at the Q output end.

With reference to the second possible implementation manner of the first aspect, in an eighth possible implementation manner, the fifth input end 145 of the test apparatus is configured to input a selection signal corresponding to the second input end of the second selector 120 and the second input end of the third selector 160;

the fourth input end 144 of the test apparatus is configured to input a selection signal corresponding to the second input end of the first selector 110;

the second input end 142 of the test apparatus is configured to input a test result that is output by a previous test apparatus;

the first selector 110 is configured to: according to the selection signal that is corresponding to the second input end of the first selector 110 and input at the fourth input end 144 of the test apparatus, determine to output the test result that is output by the previous test apparatus and input at the second input end 142 of the test apparatus to the D input end of the D flip-flop 130;

the D flip-flop 130 is configured to output, at the Q output end and on the pulse edge of the clock signal that is input at the third input end 143 of the test apparatus, the test result that is output by the previous test apparatus and input at the second input end 142 of the test apparatus; and the second output end 152 of the test apparatus is configured to output the test result that is output by the previous test apparatus and output at the Q output end.

According to a second aspect, a test apparatus is provided, including:

a first input end 141, a second input end 142, a third input end 143, a fourth input end 144, a fifth input end 145, a processing unit 170, a first output end 151, and a second output end 152, where the first input end 141 is connected to a previous circuit under test, and is configured to input a data signal of the previous circuit under test or a test result of a previous circuit under test;

the second input end 142 is connected to a test excitation signal/test result output end of a previous test apparatus, and is configured to input the test excitation signal or the test result output by the previous test apparatus;

the third input end 143 is connected to a clock signal source, and is configured to input a clock signal;

the fourth input end 144 is connected to a selection signal controller, and is configured to input a selection signal;

the fifth input end 145 is connected to a selection signal controller, and is configured to input a selection signal;

the first output end 151 is connected to a next circuit under test, and is configured to output a data signal or a test excitation signal to the next circuit under test;

the second output end 152 is connected to a test excitation signal/test result input end of a next test apparatus, and is configured to output the test excitation signal or the test result to the next test apparatus;

the processing unit 170 is configured to: when a first selection signal is input at the fifth input end 145, output, at the first output end 151, the data signal of the previous circuit under test that is input at the first input end 141 to the next circuit under test; or when a second selection signal is input at the fifth input end 145 and a second selection signal is input at the fourth input end 144, on a pulse edge of the clock signal that is input at the third input end 143, output, at the first output end 151, the test excitation signal that is input at the second input end 142 to the next circuit under test, and output, at the second output end 152, the test excitation signal that is input at the second input end 142 to the next test apparatus; or when a second selection signal is input at the fifth input end 145 and a first selection signal is input at the fourth input end 144, on a pulse edge of the clock signal that is input at the third input end 143, output, at the second output end 152, the test result of the previous circuit under test that is input at the first input end 141 to the next test apparatus; or when a second selection signal is input at the fifth input end 145 and a second selection signal is input at the fourth input end 144, on a pulse edge of the clock signal that is input at the third input end 143, output, at the second output end 152, the test result that is output by the previous test apparatus and input at the second input end 142 to the next test apparatus.

According to a third aspect, a testable asynchronous circuit is provided, including:

a clock generation circuit 710 and the test apparatus 100 according to the first aspect, where the clock generation circuit 710 includes a variable delay module 711 and an exclusive OR module 712; and the first input end 141 of the test apparatus 100 is connected to an output end of the variable delay module 711, and the first output end 151 of the test apparatus 100 is connected to a first input end of the exclusive OR module 712.

According to a fourth aspect, a testable asynchronous circuit is provided, including:

a self-clock circuit 810, a first test apparatus 100a, and a second test apparatus 100b, where either of the first test apparatus 100a and the second test apparatus 100b is the test apparatus according to the first aspect;

the self-clock circuit 810 includes a clock input end 811, a variable delay chain module 812, a clock output end 813, a first flip-flop 814, a second flip-flop 815, and a random logic module 816;

a first input end 141a of the first test apparatus 100a is connected to the clock input end 811, a first output end 151a of the first test apparatus 100a is connected to an input end of the variable delay chain module 812, and a third output end 153a of the first test apparatus 100a is connected to a clock input end of the first flip-flop 814;

a first input end 141b of the second test apparatus 100b is connected to an output end of the variable delay chain module 812, a first output end 151b of the second test apparatus 100b is connected to the clock output end 813, and a third output end 153b of the second test apparatus 100b is connected to a clock input end of the second flip-flop 815;

a third input end 143a of the first test apparatus 100a is connected to a third input end 143b of the second test apparatus 100b; and a second output end 152a of the first test apparatus 100a is connected to a second input end 142b of the second test apparatus 100b.

Based on the foregoing technical solutions, according to the test apparatus and the testable asynchronous circuit in the embodiments of the present invention, a test excitation signal is input to a circuit under test by using a D flip-flop, so that a test excitation signal can be input to an asynchronous circuit and the asynchronous circuit can be tested.

BRIEF DESCRIPTION OF DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

Figure 1:
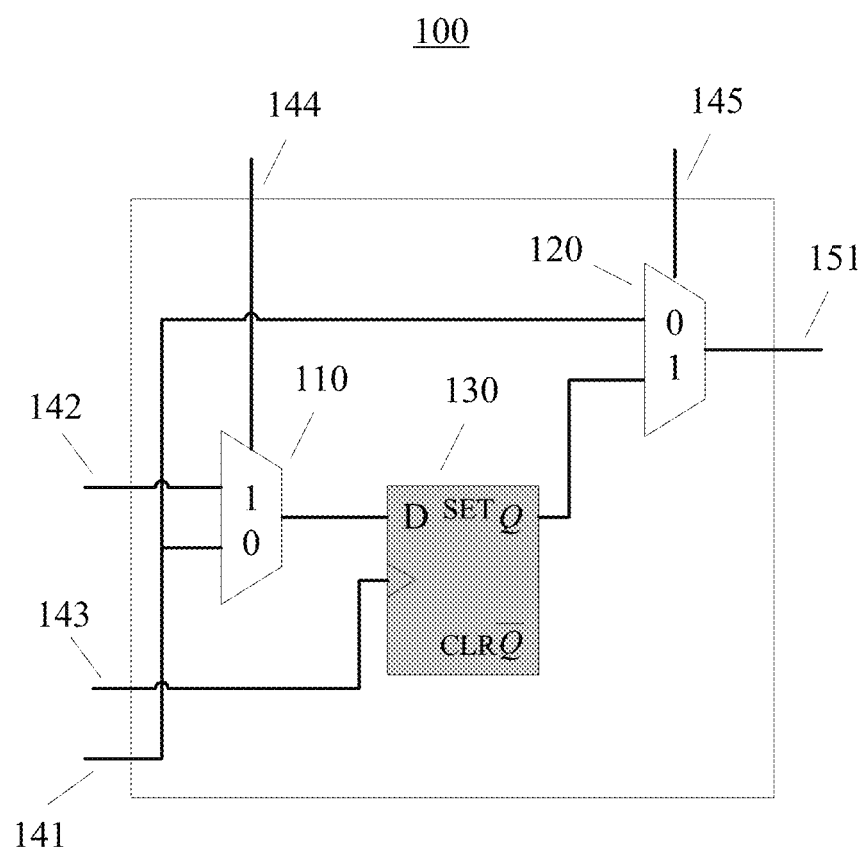
FIG. 1 is a schematic structural diagram of a test apparatus according to an embodiment of the present invention.

FIG. 1 shows a schematic structural diagram of a test apparatus 100 according to an embodiment of the present invention. As shown in FIG. 1, the test apparatus 100 includes:

a first selector 110, a second selector 120, a D flip-flop 130, a first input end 141, a second input end 142, a third input end 143, a fourth input end 144, a fifth input end 145, and a first output end 151.

The first input end 141 may be connected to a previous circuit under test, and a data signal or a test result of a previous circuit under test may be input at the first input end.

A test excitation signal may be input at the second input end 142, and the second input end 142 may be connected to a test excitation signal/test result output end of a previous test apparatus, that is, to form a test apparatus cascade. In this case, the test excitation signal or the test result output by the previous test apparatus may be input at the second input end 142.

A clock signal may be input at the third input end 143.

A selection signal may be input at the fourth input end 144 and the fifth input end 145.

The first selector 110 and the second selector 120 each have two input ends, one output end, and one selection signal end, and may each output, at the output end according to a selection signal that is input at the selection signal end, a signal that is input at one of the input ends.

A first input end of the first selector 110 and a first input end of the second selector 120 are connected to the first input end 141 of the test apparatus 100.

A second input end of the first selector 110 is connected to the second input end 142 of the test apparatus 100. It should be understood that, in other words, the second input end of the first selector 110 is used as the second input end 142 of the test apparatus 100.

A selection signal end of the first selector 110 is connected to the fourth input end 144 of the test apparatus 100. That is, a selection signal that controls the first selector 110 is input at the fourth input end 144 of the test apparatus 100.

The D flip-flop 130 has a clock signal input end, a D input end, and a Q output end. In addition, the D flip-flop 130 may also have a $\overline{Q}$ output end. The D flip-flop 130 may output, at the Q output end and on a pulse edge of a clock signal that is input at the clock signal input end, a signal that is input at the D input end.

An output end of the first selector 110 is connected to the D input end of the D flip-flop 130.

The Q output end of the D flip-flop 130 is connected to a second input end of the second selector 120.

The clock signal input end of the D flip-flop 130 is connected to the third input end 143 of the test apparatus 100.

A selection signal end of the second selector 120 is connected to the fifth input end 145 of the test apparatus 100. That is, a selection signal that controls the second selector 120 is input at the fifth input end 145 of the test apparatus 100.

An output end of the second selector 120 is connected to the first output end 151 of the test apparatus 100. It should be understood that, in other words, the output end of the second selector 120 is used as the first output end 151 of the test apparatus 100.

Based on the foregoing connection relationship, the first selector 110 may determine to output, according to the selection signal that is input at the fourth input end 144 of the test apparatus 100, the signal that is input at the first input end 141 of the test apparatus 100 or the second input end 142 of the test apparatus 100 to the D input end of the D flip-flop 130.

The D flip-flop 130 may output, at the Q output end and on the pulse edge of the clock signal that is input at the third input end 143 of the test apparatus 100, the signal that is input at the D input end.

The second selector 120 may, according to the selection signal that is input at the fifth input end 145 of the test apparatus 100, determine to output, to the first output end 151 of the test apparatus 100, the signal that is input at the first input end 141 of the test apparatus 100 or the signal that is output at the Q output end.

Therefore, according to the test apparatus in the embodiment of the present invention, a test excitation signal that is input at a second input end may pass through a D flip-flop and then be output at a first output end to a circuit under test, so that a test excitation signal can be input to an asynchronous circuit and the asynchronous circuit can be tested.

Figure 2:
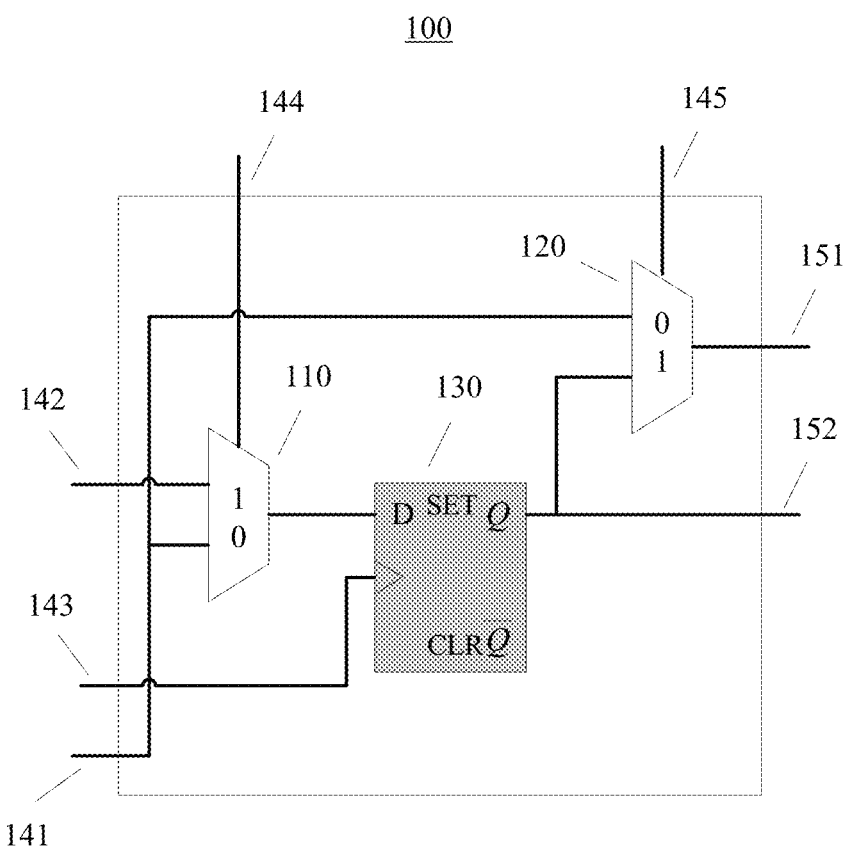
FIG. 2 is a schematic structural diagram of a test apparatus according to another embodiment of the present invention.

In this embodiment of the present invention, optionally, as shown in FIG. 2, the test apparatus 100 may further include:

a second output end 152, connected to the Q output end. A signal that is output at the Q output end may be output at the second output end 152.

The test apparatus 100 may be cascaded with another test apparatus by using the second input end 142 and the second output end 152. Specifically, the second input end 142 is connected to the excitation signal/test result output end of the previous test apparatus (for example, the second output end 152 of the test apparatus in this embodiment of the present invention), and is configured to input the test excitation signal or the test result that is output by the previous test apparatus. The second output end 152 is connected to a test excitation signal/test result input end of a next test apparatus (for example, the second input end 142 of the test apparatus in this embodiment of the present invention), and is configured to output the test excitation signal or the test result to the next test apparatus.

Figure 3:
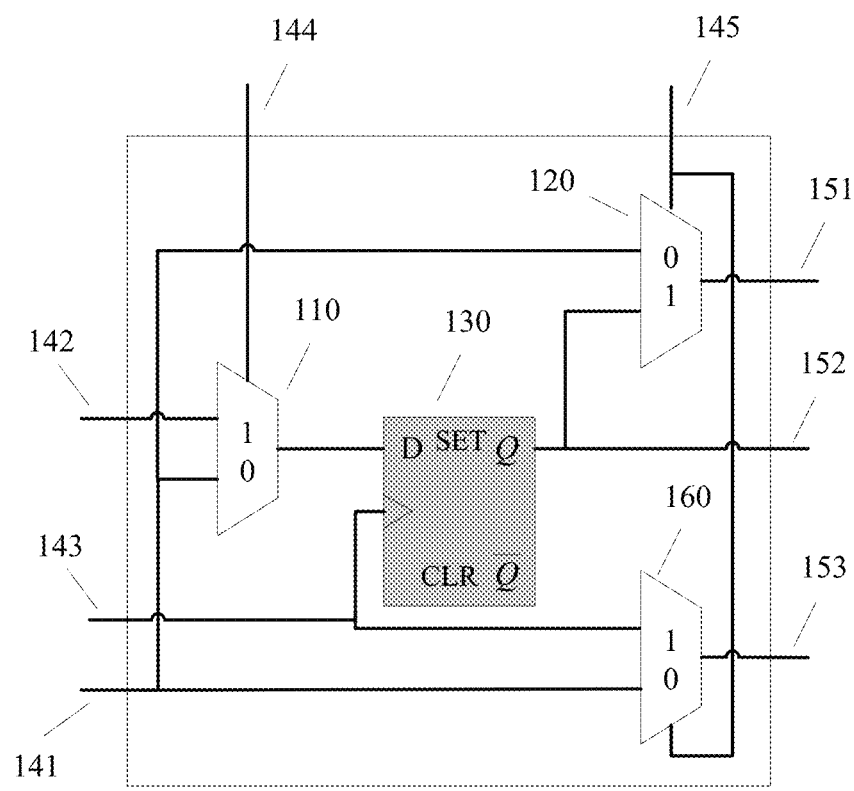
FIG. 3 is a schematic structural diagram of a test apparatus according to still another embodiment of the present invention.

In this embodiment of the present invention, optionally, as shown in FIG. 3, the test apparatus 100 may further include:

a third selector 160 and a third output end 153.

The third selector 160 has two input ends, one output end, and one selection signal end, and may output, at the output end according to a selection signal that is input at the selection signal end, a signal that is input at one of the input ends.

A first input end of the third selector 160 is connected to the first input end 141 of the test apparatus 100.

A second input end of the third selector 160 is connected to the third input end 143 of the test apparatus 100.

The selection signal end of the third selector 160 is connected to the fifth input end 145 of the test apparatus 100, that is, a selection signal that simultaneously controls the second selector 120 and the third selector 160 is input at the fifth input end 145 of the test apparatus 100.

The output end of the third selector 160 is connected to the third output end 153 of the test apparatus 100. It should be understood that, in other words, the output end of the third selector 160 is used as the third output end 153 of the test apparatus 100.

Based on the foregoing connection relationship, the third selector 160 may select to output, according to the selection signal that is input at the fifth input end 145 of the test apparatus 100, the signal that is input at the first input end 141 of the test apparatus 100 or the signal that is input at the third input end 143 of the test apparatus 100 to the third output end 153 of the test apparatus 100.

The test apparatus in the embodiment of the present invention may be cascaded with another test apparatus, thereby implementing a scan test. The another test apparatus may be the test apparatus in this embodiment of the present invention, or may be a test apparatus in an existing synchronous circuit.

Figure 4:
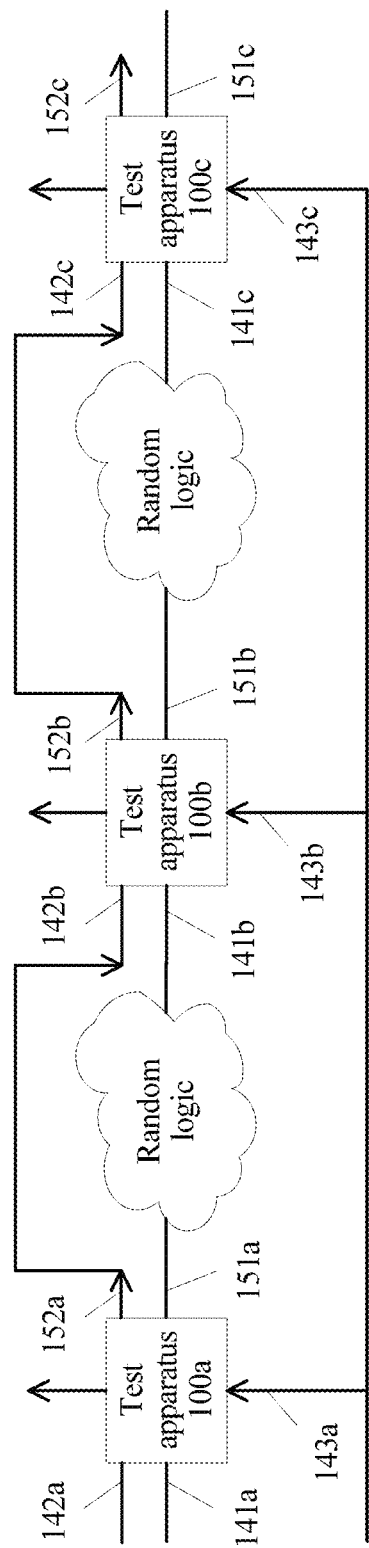
FIG. 4 is a schematic diagram of a test apparatus cascade according to an embodiment of the present invention.

FIG. 4 is a schematic diagram of a test apparatus cascade according to an embodiment of the present invention. In FIG. 4, each of a test apparatus 100a, a test apparatus 100b, and a test apparatus 100c is the test apparatus 100 in the foregoing embodiment of the present invention. A second output end 152a of the test apparatus 100a is connected to a second input end 142b of the test apparatus 100b, and a second output end 152b of the test apparatus 100b is connected to a second input end 142c of the test apparatus 100c.

Figure 5:
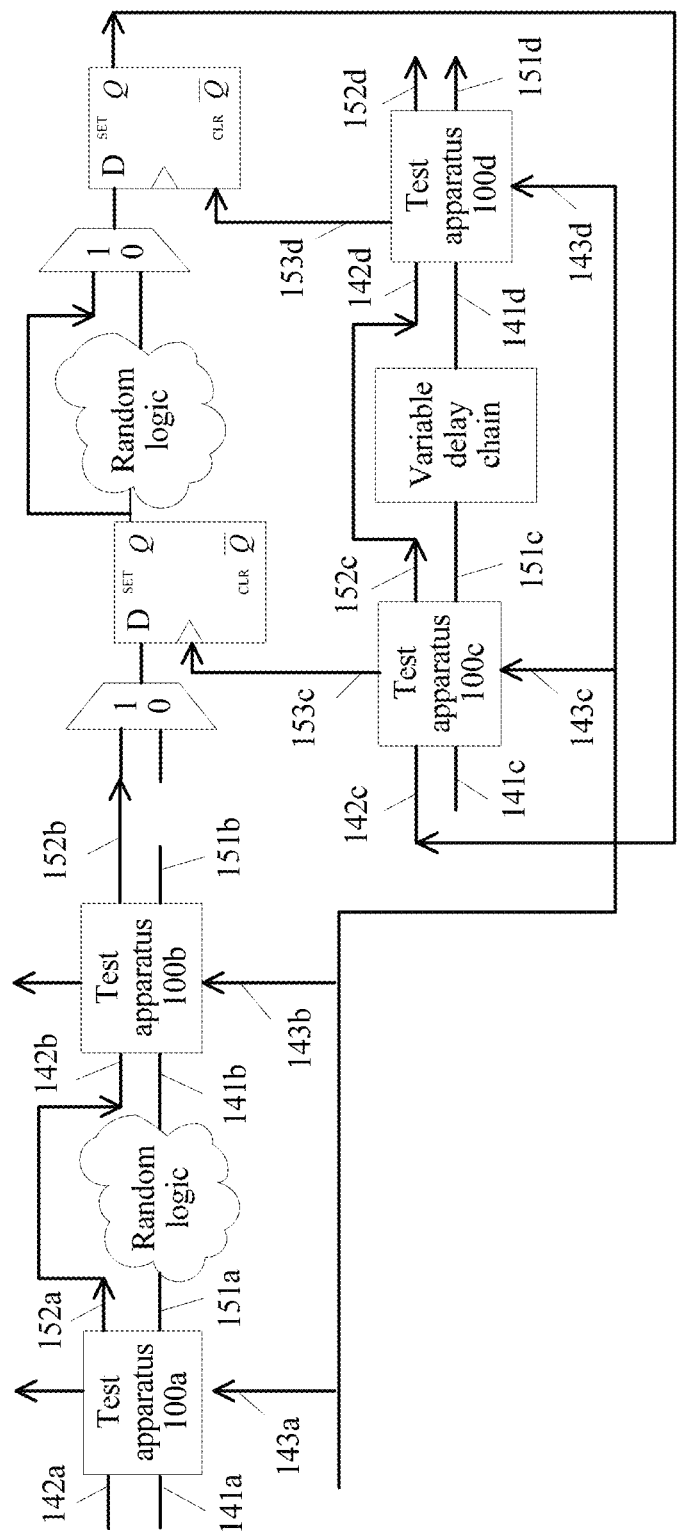
FIG. 5 is a schematic diagram of a test apparatus cascade according to another embodiment of the present invention.

FIG. 5 is a schematic diagram of a test apparatus cascade according to another embodiment of the present invention. In FIG. 5, each of a test apparatus 100a, a test apparatus 100b, a test apparatus 100c, and a test apparatus 100d is the test apparatus 100 in the foregoing embodiment of the present invention. A second output end 152a of the test apparatus 100a is connected to a second input end 142b of the test apparatus 100b. A next-level test apparatus of the test apparatus 100b is a test apparatus with a synchronous circuit, and a second output end 152b of the test apparatus 100b is connected to a test excitation signal/test result input end of the next-level test apparatus. A previous-level test apparatus of the test apparatus 100c is a test apparatus with a synchronous circuit, and a second input end 142c of the test apparatus 100c is connected to a test excitation signal/test result output end of the previous-level test apparatus. A second output end 152c of the test apparatus 100c is connected to a second input end 142d of the test apparatus 100d.

In an embodiment of the present invention, optionally, a selection signal corresponding to a first input end of the second selector 120 is input at the fifth input end 145 of the test apparatus 100.

A data signal is input at the first input end 141 of the test apparatus 100.

The second selector 120 determines to output, according to the selection signal that is corresponding to the first input end of the second selector 120 and input at the fifth input end 145 of the test apparatus, the data signal that is input at the first input end 141 of the test apparatus 100 to the first output end 151 of the test apparatus 100.

In this embodiment, the test apparatus 100 is in a normal working mode, that is, a test is not performed by the test apparatus 100. A data signal of a previous-level circuit under test enters the test apparatus 100 at the first input end 141, and is output at the first output end 151 to a next-level circuit under test. For example, in FIG. 4, the data signal enters the test apparatus 100b at the first input end 141b of the test apparatus 100b, and is output at the first output end 151b of the test apparatus 100b to the next-level circuit under test.

In the normal working mode, the test apparatus 100 is not sensitive to the first selector 110, and usually in this case, a fixed electrical level may be input at the second input end 142 and the third input end 143.

The selection signal that is input at the fifth input end 145 of the test apparatus 100 may be referred to as a mode selection signal. By using the mode selection signal, the normal working mode or a test mode in the following embodiment may be selected. When the mode selection signal is a selection signal (a first selection signal, such as 0) corresponding to the first input end of the second selector 120, the normal working mode is selected. When the mode selection signal is a selection signal (a second selection signal, such as 1) corresponding to the second input end of the second selector 120, the test mode is selected.

Optionally, when the test apparatus 100 includes the third selector 160, that is, the test apparatus 100 shown in FIG. 3, the third selector 160 is similar to the second selector 120. By using the selection signal (which may be referred to as a mode selection signal) that is input at the fifth input end 145 of the test apparatus 100, the normal working mode or the test mode is selected.

Specifically, in this case, a selection signal corresponding to the first input end of the second selector 120 and the first input end of the third selector 160 is input at the fifth input end 145 of the test apparatus 100.

A data signal is input at the first input end 141 of the test apparatus 100.

The second selector 120 determines to output, according to the selection signal that is corresponding to the first input end of the second selector 120 and the first input end of the third selector 160 and input at the fifth input end 145 of the test apparatus 100, the data signal that is input at the first input end 141 of the test apparatus 100 to the first output end 151 of the test apparatus 100. The third selector 160 determines to output, according to the selection signal that is corresponding to the first input end of the second selector 120 and the first input end of the third selector 160 and input at the fifth input end 145 of the test apparatus 100, the data signal that is input at the first input end 141 of the test apparatus 100 to the third output end 153 of the test apparatus 100.

That is, for the test apparatus 100 shown in FIG. 3, in the normal working mode, a signal of the previous-level circuit under test enters the test apparatus 100 at the first input end 141, the signal is output at the first output end 151 and enters a circuit under test, and the signal is also output at the third output end 153 and enters another circuit under test. For example, in FIG. 5, a data signal enters the test apparatus 100c at the first input end 141c of the test apparatus 100c, the data signal is output at the first output end 151c of the test apparatus 100c to a variable delay chain module, and the data signal is also output at the third output end 153c of the test apparatus 100c to a flip-flop.

In another embodiment of the present invention, optionally, a selection signal corresponding to the second input end of the second selector 120 is input at the fifth input end 145 of the test apparatus 100.

A selection signal corresponding to the second input end of the first selector 110 is input at the fourth input end 144 of the test apparatus 100.

A test excitation signal is input at the second input end 142 of the test apparatus 100.

The first selector 110 determines to output, according to the selection signal that is corresponding to the second input end of the first selector 110 and input at the fourth input end 144 of the test apparatus 100, the test excitation signal that is input at the second input end 142 of the test apparatus 100 to the D input end of the D flip-flop 130.

The D flip-flop 130 outputs, at the Q output end and on the pulse edge of the clock signal that is input at the third input end 143 of the test apparatus 100, the test excitation signal that is input at the second input end 142 of the test apparatus 100.

The second selector 120 determines to output, according to the selection signal that is corresponding to the second input end of the second selector 120 and input at the fifth input end 145 of the test apparatus 100, the test excitation signal that is output at the Q output end to the first output end 151 of the test apparatus 100.

In this embodiment, the test apparatus 100 is in the test mode, and is in a shift function mode in the test mode. A selection signal corresponding to the second input end of the second selector 120 is input at the fifth input end 145 of the test apparatus 100, and the test mode is selected. In the test mode, by using the selection signal that is input at the fourth input end 144 of the test apparatus 100, the shift function mode or a capture function mode in the following embodiment is selected. The selection signal that is input at the fourth input end 144 of the test apparatus 100 may be referred to as a function selection signal. When the function selection signal is a selection signal (a first selection signal, such as 0) corresponding to the first input end of the first selector 110, the capture function mode is selected. When the function selection signal is a selection signal (a second selection signal, such as 1) corresponding to the second input end of the first selector 110, the shift function mode is selected.

In the shift function mode, a signal that is input at the second input end 142 is selected and output to the D input end of the D flip-flop 130 by the first selector 110, passes through the D flip-flop 130 along with the clock signal that is input at the third input end 143, and is output at the Q output end. In different test stages, the signal that is input at the second input end 142 may be a test excitation signal or a test result.

When a test excitation signal is input at the second input end 142, the test excitation signal is selected and output to the D input end of the D flip-flop 130 by the first selector 110, passes through the D flip-flop 130 along with the clock signal, and is output at the Q output end.

The test excitation signal that is output at the Q output end is selected and output to the first output end 151 by the second selector 120, and then is applied to the circuit under test.

Alternatively, the signal that is output at the Q output end may be transferred to a next-level test apparatus (for example, in the scenarios shown in FIG. 4 and FIG. 5) at the second output end 152. When the test excitation signal is input at the second input end 142, serial transfer of the test excitation signal may be implemented. When a test result is input at the second input end 142, serial transfer of the test result may be implemented.

Optionally, for the test apparatus 100 shown in FIG. 3, in the shift function mode in the test mode, specifically, a selection signal corresponding to the second input end of the second selector 120 and the second input end of the third selector 160 is input at the fifth input end 145 of the test apparatus 100.

A selection signal corresponding to the second input end of the first selector 110 is input at the fourth input end 144 of the test apparatus 100.

A test excitation signal is input at the second input end 142 of the test apparatus 100.

The first selector 110 determines to output, according to the selection signal that is corresponding to the second input end of the first selector 110 and input at the fourth input end 144 of the test apparatus 100, the test excitation signal that is input at the second input end 142 of the test apparatus 100 to the D input end of the D flip-flop 130.

The D flip-flop 130 outputs, at the Q output end and on the pulse edge of the clock signal that is input at the third input end 143 of the test apparatus 100, the test excitation signal that is input at the second input end 142 of the test apparatus 100.

The test excitation signal that is output at the Q output end is output at the second output end 152 of the test apparatus 100.

The second selector 120 determines to output, according to the selection signal that is corresponding to the second input end of the second selector 120 and the second input end of the third selector 160 and input at the fifth input end 145 of the test apparatus 100, the test excitation signal that is output at the Q output end to the first output end 151 of the test apparatus 100.

The third selector 160 determines to output, according to the selection signal that is corresponding to the second input end of the second selector 120 and the second input end of the third selector 160 and input at the fifth input end 145 of the test apparatus 100, the clock signal that is input at the third input end 143 of the test apparatus 100 to the third output end 153 of the test apparatus 100.

When the third selector 160 is included, in the test mode, the third selector 160 selects and outputs the clock signal that is input at the third input end 143 to the third output end 153. In this way, the clock signal may be input to another module in the circuit, to facilitate a scan test on the another module. For example, in FIG. 5, the clock signal is output at the 153c and the 153d to the flip-flop in the circuit.

In another embodiment of the present invention, optionally, a selection signal corresponding to the second input end of the second selector 120 and the second input end of the third selector 160 is input at the fifth input end 145 of the test apparatus 100.

A selection signal corresponding to the first input end of the first selector 110 is input at the fourth input end 144 of the test apparatus 100.

A test result of a previous circuit under test is input at the first input end 141 of the test apparatus 100.

The first selector 110 determines to output, according to the selection signal that is corresponding to the first input end of the first selector 110 and input at the fourth input end 144 of the test apparatus 100, the test result of the previous circuit under test that is input at the first input end 141 of the test apparatus 100 to the D input end of the D flip-flop 130.

The D flip-flop 130 outputs, at the Q output end and on the pulse edge of the clock signal that is input at the third input end 143 of the test apparatus 100, the test result of the previous circuit under test and input at the first input end 141 of the test apparatus 100.

The test result of the previous circuit under test that is output at the Q output end is output at the second output end 152 of the test apparatus 100.

In this embodiment, the test apparatus 100 is in the capture function mode in the test mode. A selection signal corresponding to the second input end of the second selector 120 and the second input end of the third selector 160 is input at the fifth input end 145 of the test apparatus 100, and the test mode is selected. In the test mode, a selection signal corresponding to the first input end of the first selector 110 is input at the fourth input end 144 of the test apparatus 100, and the capture function mode is selected.

After the test excitation signal is applied to each circuit under test, each circuit under test outputs a test result, and the test result of the previous circuit under test is output at the first input end 141 of the test apparatus 100 to the test apparatus 100. In the capture function mode, the test result of the previous circuit under test that is input at the first input end 141 is selected and output to the D input end of the D flip-flop 130 by the first selector 110, passes through the D flip-flop 130 along with the clock signal, is output at the Q output end, and is then output to the second output end 152.

Optionally, the test result that is output at the Q output end may be further transferred to a next test apparatus (for example, in the scenarios shown in FIG. 4 and FIG. 5) at the second output end 152. In the shift function mode, serial transfer of the test result may also be implemented, and finally the test result is output to the outside of the chip.

Specifically, a selection signal corresponding to the second input end of the second selector 120 and the second input end of the third selector 160 is input at the fifth input end 145 of the test apparatus 100.

A selection signal corresponding to the second input end of the first selector 110 is input at the fourth input end 144 of the test apparatus 100.

A test result that is output by the previous test apparatus is input at the second input end 142 of the test apparatus 100.

The first selector 110 determines to output, according to the selection signal that is corresponding to the second input end of the first selector 110 and input at the fourth input end 144 of the test apparatus 100, the test result that is output by the previous test apparatus and input at the second input end 142 of the test apparatus 100 to the D input end of the D flip-flop 130.

The D flip-flop 130 outputs, at the Q output end and on the pulse edge of the clock signal that is input at the third input end 143 of the test apparatus 100, the test result that is output by the previous test apparatus and input at the second input end 142 of the test apparatus 100.

The test result that is output by the previous test apparatus at the Q output end is output at the second output end 152 of the test apparatus 100.

That is, when the test apparatus cascades (such as the scenarios shown in FIG. 4 or FIG. 5), in the capture function mode, a test result at each level is output to a second output end of a corresponding test apparatus, so as to reach a second input end of a next-level test apparatus that is connected to the test apparatus. Then, the shift function mode is switched, and a test result that is input at a second input end of a test apparatus at each level passes through a D flip-flop of the test apparatus, and is output at a second output end of the test apparatus, so that serial transfer of the test result may be implemented, and finally the test result is output to the outside of the chip.

According to the test apparatus in this embodiment of the present invention, serial transfer of a test excitation signal and serial transfer of a test result can be implemented by means of cascading, so that a scan test can be performed on an asynchronous circuit.

Figure 6:
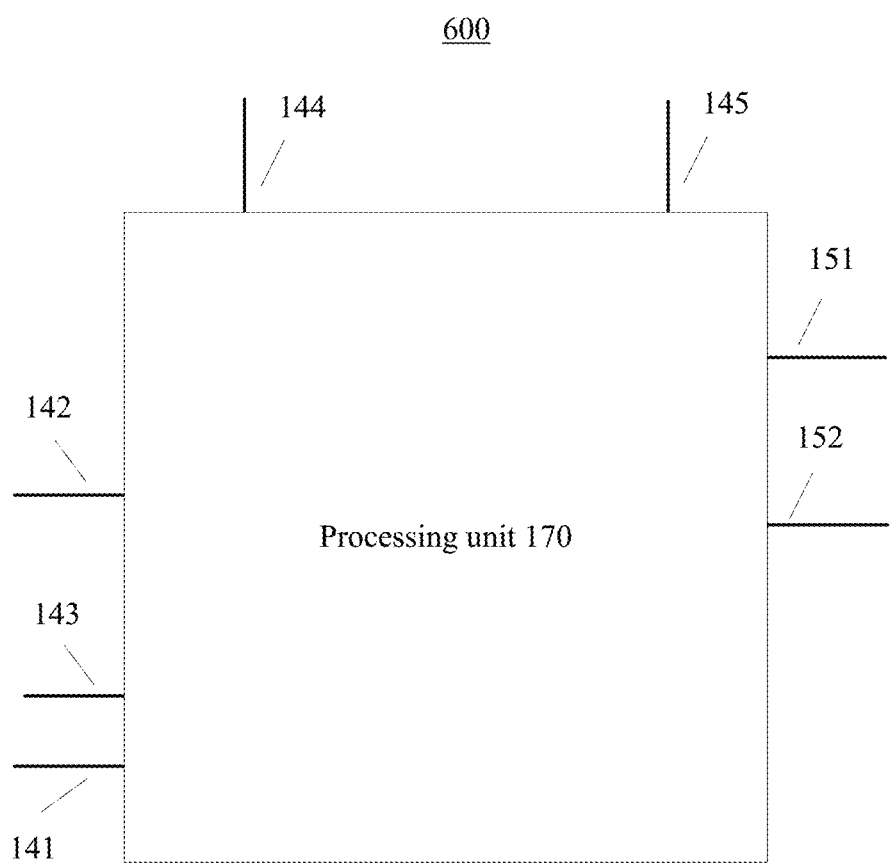
FIG. 6 is a schematic block diagram of a test apparatus according to still another embodiment of the present invention.

FIG. 6 shows a schematic block diagram of a test apparatus 600 according to another embodiment of the present invention. As shown in FIG. 6, the test apparatus 600 includes: a first input end 141, a second input end 142, a third input end 143, a fourth input end 144, a fifth input end 145, a processing unit 170, a first output end 151, and a second output end 152.

The first input end 141 is connected to a previous circuit under test, and is configured to input a data signal of the previous circuit under test or a test result of a previous circuit under test.

The second input end 142 is connected to a test excitation signal/test result output end of a previous test apparatus, and is configured to input the test excitation signal or the test result output by the previous test apparatus.

The third input end 143 is connected to a clock signal source, and is configured to input a clock signal.

The fourth input end 144 is connected to a selection signal controller, and is configured to input a selection signal.

The fifth input end 145 is connected to a selection signal controller, and is configured to input a selection signal.

The first output end 151 is connected to a next circuit under test, and is configured to output a data signal or a test excitation signal to the next circuit under test.

The second output end 152 is connected to a test excitation signal/test result input end of a next test apparatus, and is configured to output the test excitation signal or the test result to the next test apparatus.

The processing unit 170 may implement functions of the first selector 110, the second selector 120, the D flip-flop 130, and the third selector 160 that are described above.

Specifically, when a first selection signal is input at the fifth input end 145, the processing unit 170 outputs, at the first output end 151, the data signal of the previous circuit under test that is input at the first input end 141 to the next circuit under test; or when a second selection signal is input at the fifth input end 145 and a second selection signal is input at the fourth input end 144, on a pulse edge of the clock signal that is input at the third input end 143, outputs, at the first output end 151, the test excitation signal that is input at the second input end 142 to the next circuit under test, and outputs, at the second output end 152, the test excitation signal that is input at the second input end 142 to the next test apparatus; or when a second selection signal is input at the fifth input end 145 and a first selection signal is input at the fourth input end 144, on a pulse edge of the clock signal that is input at the third input end 143, outputs, at the second output end 152, the test result of the previous circuit under test that is input at the first input end 141 to the next test apparatus; or when a second selection signal is input at the fifth input end 145 and a second selection signal is input at the fourth input end 144, on a pulse edge of the clock signal that is input at the third input end 143, outputs, at the second output end 152, the test result that is output by the previous test apparatus and input at the second input end 142 to the next test apparatus.

According to the test apparatus in this embodiment of the present invention, serial transfer of a test excitation signal and serial transfer of a test result can be implemented, so that a scan test can be performed on an asynchronous circuit.

The foregoing describes the test apparatus in the embodiments of the present invention, and the following describes a testable asynchronous circuit to which the test apparatus in the embodiments of the present invention is applied.

Figure 7:
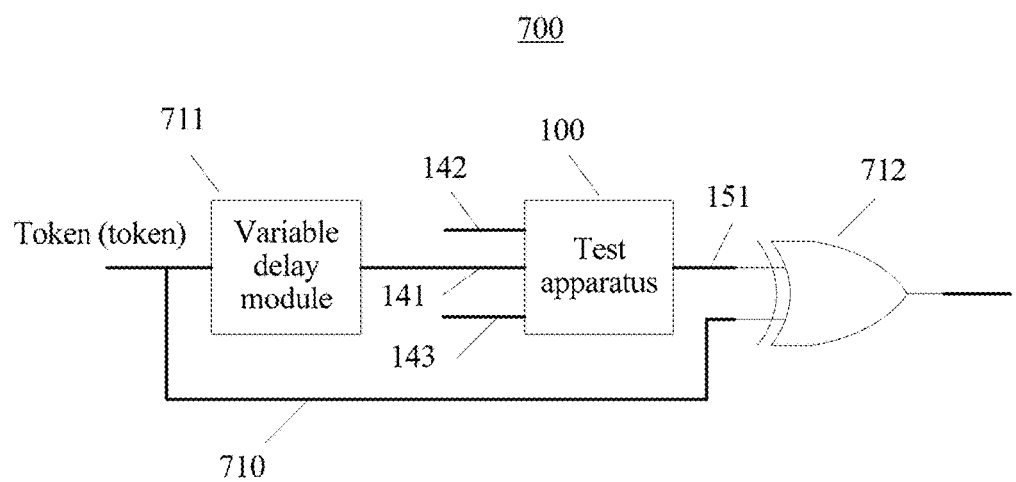
FIG. 7 is a schematic structural diagram of a testable asynchronous circuit according to an embodiment of the present invention.

FIG. 7 shows a schematic structural diagram of a testable asynchronous circuit 700 according to an embodiment of the present invention. As shown in FIG. 7, the testable asynchronous circuit 700 includes: a clock generation circuit 710 and the foregoing test apparatus 100.

The clock generation circuit 710 includes a variable delay module 711 and an exclusive OR module 712. A function of the circuit is to generate a clock signal, and a token is a level signal that rotates intermittently (rotation time is uncertain). Therefore, in most cases, the circuit outputs 0, and 1 may occur in a short time period only when the token rotates, so it is very difficult to detect circuit quality without the test apparatus 100.

In this embodiment of the present invention, the test apparatus 100 is added to a path after the variable delay module 711. That is, the test apparatus 100 is located between the variable delay module 711 and the exclusive OR module 712. A first input end 141 of the test apparatus 100 is connected to an output end of the variable delay module 711, and a first output end 151 of the test apparatus 100 is connected to a first input end of the exclusive OR module 712.

In a normal working mode, a signal that is output from the variable delay module 711 enters the test apparatus 100 at the first input end 141 of the test apparatus 100, and is output at the first output end 151 of the test apparatus 100 to the exclusive OR module 712.

In a test mode, a clock signal is input at a third input end 143 of the test apparatus 100.

A test excitation signal is input at a second input end 142 of the test apparatus 100.

The test excitation signal that is input at the second input end 142 is output at the first output end 151, and enters the exclusive OR module 712, so that the circuit can be tested.

Figure 8:
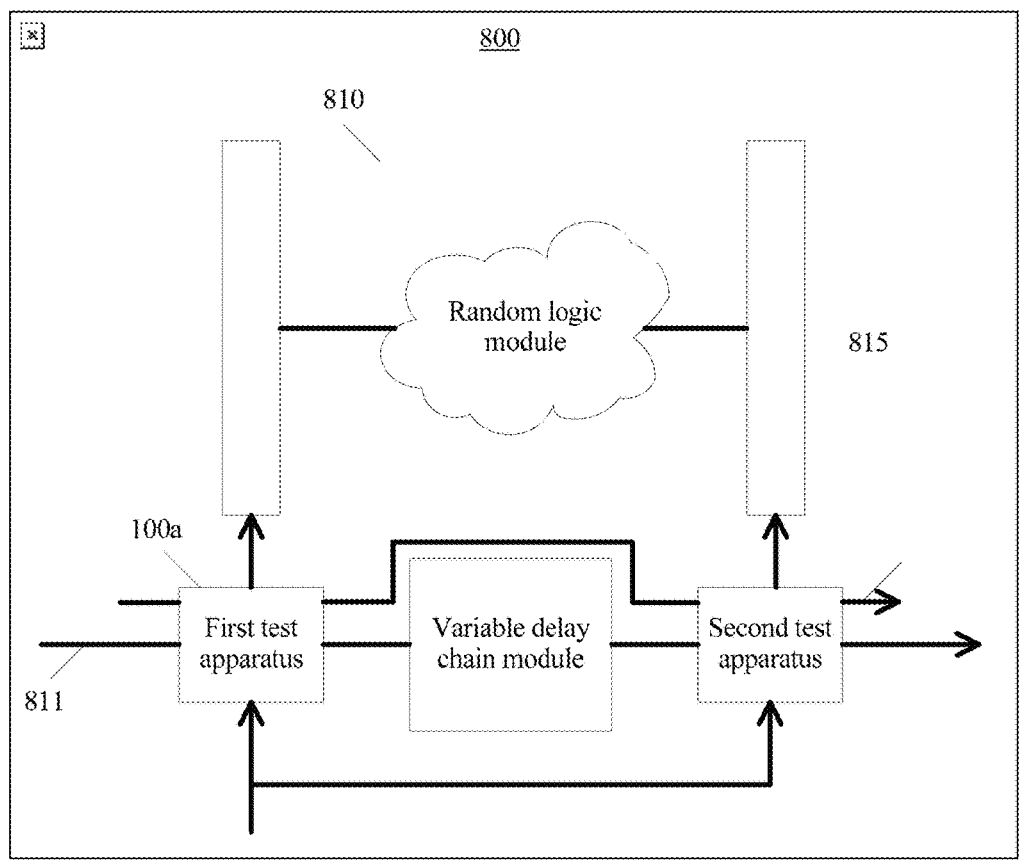
FIG. 8 is a schematic structural diagram of a testable asynchronous circuit according to another embodiment of the present invention.

FIG. 8 shows a schematic structural diagram of a testable asynchronous circuit 800 according to an embodiment of the present invention. As shown in FIG. 8, the testable asynchronous circuit 800 includes: a self-clock circuit 810, a first test apparatus 100a, and a second test apparatus 100b.

Either of the first test apparatus 100a and the second test apparatus 100b is the test apparatus 100 shown in FIG. 3.

The self-clock circuit 810 includes a clock input end 811, a variable delay chain module 812, a clock output end 813, a first flip-flop 814, a second flip-flop 815, and a random logic module 816.

The first test apparatus 100a is located between the clock input end 811 and the variable delay chain module 812. A first input end 141a of the first test apparatus 100a is connected to the clock input end 811, a first output end 151a of the first test apparatus 100a is connected to an input end of the variable delay chain module 812, and a third output end 153a of the first test apparatus 100a is connected to a clock input end of the first flip-flop 814.

The second test apparatus 100b is located between the variable delay chain module 812 and the clock output end 813. A first input end 141b of the second test apparatus 100b is connected to an output end of the variable delay chain module 812, a first output end 151b of the second test apparatus 100b is connected to the clock output end 813, and a third output end 153b of the second test apparatus 100b is connected to a clock input end of the second flip-flop 815.

A third input end 143a of the first test apparatus 100a is connected to a third input end 143b of the second test apparatus 100b, and a scan clock signal may be input at both the third input end 143a and the third input end 143b.

A second output end 152a of the first test apparatus 100a is connected to a second input end 142b of the second test apparatus 100b.

In a normal working mode, the clock signal that is input at the clock input end 811 is input at the first input end 141a of the first test apparatus 100a to the first test apparatus 100a, the clock signal is output at the first output end 151a of the first test apparatus 100a and enters the variable delay chain module 812, and the clock signal is also output at the third output end 153a of the first test apparatus 100a and enters the first flip-flop 814. The clock signal that is output at the variable delay chain module 812 enters the second test apparatus 100b at the first input end 141b of the second test apparatus 100b, the clock signal is output at the first output end 151b of the second test apparatus 100b to the clock output end 813, and the clock signal is also output at the third output end 153b of the second test apparatus 100b and enters the second flip-flop 815.

In a shift function mode in a test mode, the scan clock signal is input at the third input end 143a of the first test apparatus 100a and the third input end 143b of the second test apparatus 100b.

A test excitation signal is input at the second input end 142a of the first test apparatus 100a, and the test excitation signal is output at the first output end 151a of the first test apparatus 100a to the variable delay chain module 812, so that the variable delay chain module 812 can be tested.

The test excitation signal is output at the second output end 152a of the first test apparatus 100a to the second input end 142b of the second test apparatus 100b, so as to implement serial transfer of the test excitation signal.

The scan clock signal is output at the third output end 153a of the first test apparatus 100a to the first flip-flop 814, so as to provide a uniform scan clock signal for the first flip-flop 814.

The scan clock signal is output at the third output end 153b of the second test apparatus 100b to the second flip-flop 815, so as to provide a uniform scan clock signal for the second flip-flop 815.

When a test result of the variable delay chain module 812 is output to the first input end 141b of the second test apparatus 100b, the mode is switched to a capture function mode in the test mode, and the test result that is output by the variable delay chain module 812 is output at the second output end 152b of the second test apparatus 100b.

In a cascade case, the capture function mode is then switched to the shift function mode, and the test result is transferred to a next test apparatus at the second output end 152b of the second test apparatus 100b, so that serial transfer of the test result is implemented, and finally the test result is output to the outside of the chip. Therefore, the testable asynchronous circuit in this embodiment of the present invention can perform a scan test on an asynchronous circuit.

It should be understood that, the specific examples in the foregoing descriptions are merely intended to help a person skilled in the art better understand the embodiments of the present invention, but are not intended to limit the scope of the embodiments of the present invention.

A person of ordinary skill in the art may be aware that, in combination with the examples described in the embodiments disclosed in this specification, units and algorithm steps may be implemented by electronic hardware, computer software, or a combination thereof. To clearly describe the interchangeability between the hardware and the software, the foregoing has generally described compositions and steps of each example according to functions. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. A part or all of the units may be selected according to actual needs to achieve the objectives of the solutions of the embodiments of the present invention.

In addition, functional units in the embodiments of the present invention may be integrated into one processing unit, or each of the units may exist alone physically, or two or more units are integrated into one unit. The integrated unit may be implemented in a form of hardware, or may be implemented in a form of a software functional unit.

When the integrated unit is implemented in the form of a software functional unit and sold or used as an independent product, the integrated unit may be stored in a computer-readable storage medium. Based on such an understanding, the technical solutions of the present invention essentially, or the part contributing to the prior art, or all or a part of the technical solutions may be implemented in the form of a software product. The software product is stored in a storage medium and includes several instructions for instructing a computer device (which may be a personal computer, a server, or a network device) to perform all or a part of the steps of the methods described in the embodiments of the present invention. The foregoing storage medium includes: any medium that can store program code, such as a USB flash drive, a removable hard disk, a read-only memory (ROM, Read-Only Memory), a random access memory (RAM, Random Access Memory), a magnetic disk, or an optical disc.

The foregoing descriptions are merely specific embodiments of the present invention, but are not intended to limit the protection scope of the present invention. Any modification or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A test apparatus, comprising:
   a first input end, a second input end, a third input end, a fourth input end, a fifth input end, a first selector, a second selector, a D flip-flop, and a first output end, wherein
   a) the first input end is configured to input a data signal or a test result of a previous circuit under test,
   b) the second input end is configured to input a test excitation signal or a test result that is output by a previous test apparatus,
   c) the third input end is configured to input a clock signal,
   d) the fourth input end is configured to input a selection signal, and
   e) the fifth input end is configured to input a selection signal;
   a first input end of the first selector and a first input end of the second selector are connected to the first input end of the test apparatus;
   a second input end of the first selector is connected to the second input end of the test apparatus;
   a selection signal end of the first selector is connected to the fourth input end of the test apparatus;
   an output end of the first selector is connected to a D input end of the D flip-flop;
   a Q output end of the D flip-flop is connected to a second input end of the second selector;
   a clock signal input end of the D flip-flop is connected to the third input end of the test apparatus;
   a selection signal end of the second selector is connected to the fifth input end of the test apparatus;
   an output end of the second selector is connected to the first output end of the test apparatus;
   the first selector is configured to, according to the selection signal that is input at the fourth input end of the test apparatus, determine to output the signal that is input at the first input end of the test apparatus or the second input end of the test apparatus to the D input end of the D flip-flop;
   the D flip-flop is configured to output, at the Q output end of the D flip-flop and on a pulse edge of the clock signal that is input at the third input end of the test apparatus, the signal that is input at the D input end;
   the second selector is configured to, according to the selection signal that is input at the fifth input end of the test apparatus, determine to output, to the first output end of the test apparatus, the signal that is input at the first input end of the test apparatus or the signal that is output at the Q output end of the D flip-flop;
   a second output end, a third selector and a third output end, wherein, the second output end is connected to the Q output end of the D flip-flop;
   a first input end of the third selector is connected to the first input end of the test apparatus, a second input end of the third selector is connected to the third input end of the test apparatus, a selection signal end of the third selector is connected to the fifth input end of the test apparatus, and an output end of the third selector is connected to the third output end of the test apparatus; and
   the third selector is configured to, according to the selection signal that is input at the fifth input end of the test apparatus, determine to output the signal that is input at the first input end of the test apparatus or the signal that is input at the third input end of the test apparatus to the third output end of the test apparatus.

2. The test apparatus according to claim 1, wherein:
the fifth input end of the test apparatus is configured to input a selection signal corresponding to the first input end of the second selector;
the first input end of the test apparatus is configured to input a data signal; and
the second selector is configured to, according to the selection signal that is corresponding to the first input end of the second selector and input at the fifth input end of the test apparatus, determine to output the data signal that is input at the first input end of the test apparatus to the first output end of the test apparatus.

3. The test apparatus according to claim 1, wherein:
the fifth input end of the test apparatus is configured to input a selection signal corresponding to the second input end of the second selector;
the fourth input end of the test apparatus is configured to input a selection signal corresponding to the second input end of the first selector;
the second input end of the test apparatus is configured to input a test excitation signal;
the first selector is configured to, according to the selection signal that is corresponding to the second input end of the first selector and input at the fourth input end of the test apparatus, determine to output the test excitation signal that is input at the second input end of the test apparatus to the D input end of the D flip-flop;
the D flip-flop is configured to output, at the Q output end and on the pulse edge of the clock signal that is input at the third input end of the test apparatus, the test excitation signal that is input at the second input end of the test apparatus; and
the second selector is configured to: according to the selection signal that is corresponding to the second input end of the second selector and input at the fifth input end of the test apparatus, determine to output, to the first output end of the test apparatus, the test excitation signal that is output at the Q output end.

4. The test apparatus according to claim 1, wherein:
the fifth input end of the test apparatus is configured to input a selection signal corresponding to the first input end of the second selector and the first input end of the third selector;
the first input end of the test apparatus is configured to input a data signal;
the second selector is configured to, according to the selection signal that is corresponding to the first input end of the second selector and the first input end of the third selector and input at the fifth input end of the test apparatus, determine to output the data signal that is input at the first input end of the test apparatus to the first output end of the test apparatus; and
the third selector is configured to, according to the selection signal that is corresponding to the first input end of the second selector and the first input end of the third selector and input at the fifth input end of the test apparatus, determine to output the data signal that is input at the first input end of the test apparatus to the third output end of the test apparatus.

5. The test apparatus according to claim 1, wherein:
the fifth input end of the test apparatus is configured to input a selection signal corresponding to the second input end of the second selector and the second input end of the third selector;
the fourth input end of the test apparatus is configured to input a selection signal corresponding to the second input end of the first selector;
the second input end of the test apparatus is configured to input a test excitation signal;
the first selector is configured to, according to the selection signal that is corresponding to the second input end of the first selector and input at the fourth input end of the test apparatus, determine to output the test excitation signal that is input at the second input end of the test apparatus to the D input end of the D flip-flop;
the D flip-flop is configured to output, at the Q output end and on the pulse edge of the clock signal that is input at the third input end of the test apparatus, the test excitation signal that is input at the second input end of the test apparatus;
the second output end of the test apparatus is configured to output the test excitation signal that is output at the Q output end;
the second selector is configured to, according to the selection signal that is corresponding to the second input end of the second selector and the second input end of the third selector and input at the fifth input end of the test apparatus, determine to output, to the first output end of the test apparatus, the test excitation signal that is output at the Q output end; and
the third selector is configured to: according to the selection signal that is corresponding to the second input end of the second selector and the second input end of the third selector and input at the fifth input end of the test apparatus, determine to output the clock signal that is input at the third input end of the test apparatus to the third output end of the test apparatus.

6. The test apparatus according to claim 1, wherein:
the fifth input end of the test apparatus is configured to input a selection signal corresponding to the second input end of the second selector and the second input end of the third selector;
the fourth input end of the test apparatus is configured to input a selection signal corresponding to the first input end of the first selector;
the first input end of the test apparatus is configured to input a test result of a previous circuit under test;
the first selector is configured to, according to the selection signal that is corresponding to the first input end of the first selector and input at the fourth input end of the test apparatus, determine to output the test result of the previous circuit under test that is input at the first input end of the test apparatus to the D input end of the D flip-flop;
the D flip-flop is configured to output, at the Q output end and on the pulse edge of the clock signal that is input at the third input end of the test apparatus, the test result of the previous circuit under test that is input at the first input end of the test apparatus; and
the second output end of the test apparatus is configured to output the test result of the previous circuit under test that is output at the Q output end.

7. The test apparatus according to claim 1, wherein:
the fifth input end of the test apparatus is configured to input a selection signal corresponding to the second input end of the second selector and the second input end of the third selector;
the fourth input end of the test apparatus is configured to input a selection signal corresponding to the second input end of the first selector;

the second input end of the test apparatus is configured to input a test result that is output by a previous test apparatus;

the first selector is configured to, according to the selection signal that is corresponding to the second input end of the first selector and input at the fourth input end of the test apparatus, determine to output the test result that is output by the previous test apparatus and input at the second input end of the test apparatus to the D input end of the D flip-flop;

the D flip-flop is configured to output, at the Q output end and on the pulse edge of the clock signal that is input at the third input end of the test apparatus, the test result that is output by the previous test apparatus and input at the second input end of the test apparatus; and the second output end of the test apparatus is configured to output the test result that is output by the previous test apparatus and output at the Q output end.

8. A test apparatus comprising:

a first input end, a second input end, a third input end, a fourth input end, a fifth input end, a processing unit, a first output end, and a second output end, wherein
  a) the first input end is connected to a previous circuit under test, and is configured to input a data signal of the previous circuit under test or a test result of a previous circuit under test;
  b) the second input end is connected to a test excitation signal/test result output end of a previous test apparatus, and is configured to input the test excitation signal or the test result output by the previous test apparatus;
  c) the third input end is connected to a clock signal source, and is configured to input a clock signal;
  d) the fourth input end is connected to a selection signal controller, and is configured to input a selection signal; and
  e) the fifth input end is connected to a selection signal controller, and is configured to input a selection signal;

the first output end is connected to a next circuit under test, and is configured to output a data signal or a test excitation signal to the next circuit under test;

the second output end is connected to a test excitation signal/test result input end of a next test apparatus, and is configured to output the test excitation signal or the test result to the next test apparatus;

the processing unit is configured to:
  a) when a first selection signal is input at the fifth input end, output, at the first output end, the data signal of the previous circuit under test that is input at the first input end to the next circuit under test; or
  b) when a second selection signal is input at the fifth input end and a second selection signal is input at the fourth input end, on a pulse edge of the clock signal that is input at the third input end, output, at the first output end, the test excitation signal that is input at the second input end to the next circuit under test, and output, at the second output end, the test excitation signal that is input at the second input end to the next test apparatus; or
  c) when a second selection signal is input at the fifth input end and a first selection signal is input at the fourth input end, on a pulse edge of the clock signal that is input at the third input end, output, at the second output end, the test result of the previous circuit under test that is input at the first input end to the next test apparatus; or
  d) when a second selection signal is input at the fifth input end and a second selection signal is input at the fourth input end, on a pulse edge of the clock signal that is input at the third input end, output, at the second output end, the test result that is output by the previous test apparatus and input at the second input end to the next test apparatus;

a second output end, a third selector and a third output end, wherein, the second output end is connected to the Q output end of the D flip-flop;

a first input end of the third selector is connected to the first input end of the test apparatus;

a second input end of the third selector is connected to the third input end of the test apparatus;

a selection signal end of the third selector is connected to the fifth input end of the test apparatus;

an output end of the third selector is connected to the third output end of the test apparatus; and the third selector is configured to, according to the selection signal that is input at the fifth input end of the test apparatus, determine to output the signal that is input at the first input end of the test apparatus or the signal that is input at the third input end of the test apparatus to the third output end of the test apparatus.

9. A testable asynchronous circuit comprising:

a clock generation circuit and the test apparatus according to claim 1, wherein the clock generation circuit comprises a variable delay module and an exclusive OR module; and the first input end of the test apparatus is connected to an output end of the variable delay module, and the first output end of the test apparatus is connected to a first input end of the exclusive OR module.

10. A testable asynchronous circuit comprising:

a self-clock circuit, a first test apparatus, and a second test apparatus, wherein either of the first test apparatus and the second test apparatus is the test apparatus according to claim 1;

the self-clock circuit comprises a clock input end, a variable delay chain module, a clock output end, a first flip-flop, a second flip-flop, and a random logic module;

a first input end of the first test apparatus is connected to the clock input end, a first output end of the first test apparatus is connected to an input end of the variable delay chain module, and a third output end of the first test apparatus is connected to a clock input end of the first flip-flop;

a first input end of the second test apparatus is connected to an output end of the variable delay chain module, a first output end of the second test apparatus is connected to the clock output end, and a third output end of the second test apparatus is connected to a clock input end of the second flip-flop;

a third input end of the first test apparatus is connected to a third input end of the second test apparatus; and a second output end of the first test apparatus is connected to a second input end of the second test apparatus.

* * * * *